United States Patent
Hoshi et al.

(10) Patent No.: US 11,456,359 B2
(45) Date of Patent: Sep. 27, 2022

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventors: Yasuyuki Hoshi, Matsumoto (JP); Yuichi Harada, Matsumoto (JP); Takashi Shiigi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 638 days.

(21) Appl. No.: 15/250,005

(22) Filed: Aug. 29, 2016

(65) Prior Publication Data

US 2017/0084699 A1 Mar. 23, 2017

(30) Foreign Application Priority Data

Sep. 17, 2015 (JP) .............................. JP2015-184248

(51) Int. Cl.
*H01L 29/45* (2006.01)
*H01L 29/16* (2006.01)
(Continued)

(52) U.S. Cl.
CPC .... *H01L 29/1608* (2013.01); *H01L 29/41741* (2013.01); *H01L 29/45* (2013.01);
(Continued)

(58) Field of Classification Search
CPC ............... H01L 29/1608; H01L 23/293; H01L 23/3192; H01L 27/088; H01L 29/45; H01L 29/66068; H01L 29/7827
(Continued)

(56) References Cited

U.S. PATENT DOCUMENTS 5,903,053 A  5/1999  Iijima et al.
6,069,047 A *  5/2000  Wanlass ............ H01L 21/28088
257/E21.204

(Continued)

FOREIGN PATENT DOCUMENTS

JP    H07-292474 A    11/1995
JP    2002-237493 A    8/2002
(Continued)

OTHER PUBLICATIONS

Krishna Shenai et al., "Optimum Semiconductors for High-Power Electronics", IEEE Transactions on Electron Devices, vol. 36, No. 9, pp. 1811-1823, Sep. 1989.

(Continued)

*Primary Examiner* — Matthew C Landau
*Assistant Examiner* — Dmitriy Yemelyanov
(74) *Attorney, Agent, or Firm* — Rabin & Berdo, P.C.

(57) ABSTRACT

A semiconductor device, including a substrate, and a deposit layer and a semiconductor layer formed sequentially on the substrate. The semiconductor layer has selectively disposed therein a first region, a second region and a contact region. A gate electrode is disposed on the first region and the semiconductor layer via a gate insulating film. A source electrode is formed in contact with the contact region and the second region. A drain electrode is disposed on the back surface of the substrate. The source electrode has a first titanium (Ti) film, and a titanium nitride (TiN) film, a second Ti film, and a metal film containing aluminum (Al) sequentially formed on the first Ti film. The source electrode may further include another TiN film, on which the first Ti film is formed.

9 Claims, 3 Drawing Sheets

(51) Int. Cl.
*H01L 29/66* (2006.01)
*H01L 29/78* (2006.01)
*H01L 29/417* (2006.01)
*H01L 23/00* (2006.01)

(52) U.S. Cl.
CPC .... *H01L 29/66068* (2013.01); *H01L 29/7802* (2013.01); *H01L 23/564* (2013.01)

(58) Field of Classification Search
USPC .......................................................... 257/77
See application file for complete search history.

(56) References Cited

U.S. PATENT DOCUMENTS

| | | | | |
|---|---|---|---|---|
| 6,410,986 | B1* | 6/2002 | Merchant | H01L 23/485 257/760 |
| 2004/0253807 | A1* | 12/2004 | Thei | H01L 21/76877 438/627 |
| 2006/0057796 | A1 | 3/2006 | Harada et al. | |
| 2006/0183327 | A1* | 8/2006 | Moon | H01L 21/76843 438/687 |
| 2012/0132912 | A1 | 5/2012 | Suekawa et al. | |
| 2015/0115285 | A1* | 4/2015 | Kinoshita | H01L 29/7839 257/77 |
| 2015/0348909 | A1* | 12/2015 | Yamazaki | H01L 27/0688 257/775 |
| 2015/0372095 | A1* | 12/2015 | Saito | H01L 29/401 257/77 |
| 2016/0027891 | A1* | 1/2016 | Yamada | H01L 21/28 257/77 |
| 2016/0126319 | A1* | 5/2016 | Ogino | H01L 29/1608 438/586 |

FOREIGN PATENT DOCUMENTS

| | | | | |
|---|---|---|---|---|
| JP | 2011-023757 A | 2/2011 | | |
| JP | 2013-016538 A | 1/2013 | | |
| JP | 2014-099444 A | 5/2014 | | |
| JP | 2015-109474 A | 6/2015 | | |
| WO | WO 2010-143376 A1 | 12/2010 | | |
| WO | WO-2013161449 A1 * | 10/2013 | ....... H01L 29/66477 |
| WO | WO-2014156791 A1 * | 10/2014 | ........... H01L 21/049 |

OTHER PUBLICATIONS

B. Jayant Baliga, "Silicon Carbide Power Devices", World Scientific Publishing Co., pp. 60-69, Jan. 5, 2006.

* cited by examiner

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2015-184248, filed on Sep. 17, 2015, the entire contents of which are incorporated herein by reference.

BACKGROUND OF THE INVENTION

1. Field of the Invention

The embodiments discussed herein relate to a semiconductor device and a method of manufacturing a semiconductor device.

2. Description of the Related Art

Conventionally, silicon (Si) is used as a constituent material of a power semiconductor device that controls high voltage and/or large current. There are several types of power semiconductor devices such as bipolar transistors, insulated-gate bipolar transistors (IGBTs), and metal oxide semiconductor field effect transistors (MOSFETs). These devices are selectively used according to intended purpose.

For example, bipolar transistors and IGBTs have high current density compared to MOSFETs, and can be adapted for large current but cannot be switched at high speed. In particular, the limit of switching frequency is about several kHz for bipolar transistors and about several tens of kHz for IGBTs. On the other hand, power MOSFETs have low current density compared to bipolar transistors and IGBTs, and are difficult to be adapted for large current but can be switched at high speed up to about several MHz.

However, there has been a strong demand in the market for a power semiconductor device achieving both large current and high speed. Thus, IGBTs and power MOSFETs have been intensively developed and improved, and the performance of power devices has substantially reached the theoretical limit determined by the material. In terms of power semiconductor devices, semiconductor materials replacing silicon have been investigated and silicon carbide (SiC) has been focused on as a semiconductor material enabling production (manufacture) of a next-generation power semiconductor device with low on voltage, high-speed characteristics, and high-temperature characteristics (see, for example, K. Shenai, et al, "Optimum Semiconductors for High-Power Electronics", IEEE Transactions on Electron Devices, September 1989, Vol. 36, No. 9, pages 1811-1823).

Silicon carbide is chemically very stable semiconductor material, has a wide band gap of 3 eV, and can be used very stably as a semiconductor even at high temperatures. Silicon carbide has a critical electric field strength that is ten times that of silicon or greater, and thus is expected to be a semiconductor material that can sufficiently reduce on-resistance. These merits of silicon carbide are common to other wide band gap semiconductors with a band gap greater than silicon, such as gallium nitride (GaN). Thus, a high-voltage semiconductor device can be achieved by using a wide band gap semiconductor (see, for example, B. Jayant Baliga, "Silicon Carbide Power Devices", U.S.A, World Scientific Publishing Co., Mar. 30, 2006, page 61).

Such a high-voltage semiconductor device using silicon carbide has a reduced loss; however, a carrier frequency that is ten times that of a conventional semiconductor device using silicon or greater is applied to the high-voltage semiconductor device when being used in an inverter. When a semiconductor device is used for high frequency applications, the temperature of generated heat emitted to the chip increases and affects the reliability of the semiconductor device. In particular, bonding wires are connected to front surface electrodes on a front surface side of a substrate, as a wiring member that carries out the voltage of the front surface electrodes. When the semiconductor device is used at high temperatures, the adhesion of the front surface electrodes and the bonding wires drops, thereby affecting the reliability.

Use of a planar conductor member other than the wire bonding has been proposed as another wiring member that carries out the voltage of the front surface electrodes (see, for example, Japanese Patent Application Laid-Open Publication No. 2014-99444).

A conventional silicon carbide semiconductor device in which pin electrodes are connected to the front surface electrodes with solder has also been proposed. FIG. 3 is a cross-sectional view depicting a structure of a conventional silicon carbide semiconductor device. An n-type silicon carbide epitaxial layer 2 is deposited on a surface of an $n^+$-type silicon carbide substrate 1, and $p^+$-type regions 10 are disposed on the surface of the n-type silicon carbide epitaxial layer 2. The p-type silicon carbide epitaxial layer 11 is disposed on the surface of the $p^+$-type regions 10. N-type well regions 12 are disposed in the p-type silicon carbide epitaxial layer 11 and on portions of the n-type silicon carbide epitaxial layer 2 where no $p^+$-type region 10 is disposed. $N^+$-type source regions 4 and $p^{++}$-type contact regions 5 are disposed on the surface of the p-type silicon carbide epitaxial layer 11.

Gate electrodes 7 are disposed, via a gate insulating film 6, on the surface of the p-type silicon carbide epitaxial layer 11, at portions between the $n^+$-type source regions 4 and the n-type well regions 12. As an interlayer insulating film 13, a phosphorus silicate glass (PSG) film 14 is selectively disposed on the gate electrodes 7. Source electrodes 8 are disposed on the surfaces of the $n^+$-type source regions 4 and the $p^{++}$-type contact regions 5. The source electrodes 8 have, for example, a two-layer structure of a first Ti film 21 and an Al—Si film 24. A protective film 15 is selectively disposed on the source electrodes 8, while plating films 16 are disposed on portions where no protective film 15 is disposed.

Second protective films 17 are disposed so as to cover junctions of the plating films 16 and the protective film 15. Solder 19 is disposed on the plating films 16 so as to connect the plating films 16 to pin electrodes 18 coupled to an external signal. A drain electrode 9 is disposed on a back surface side of the $n^+$-type silicon carbide substrate 1.

In the MOSFET having the structure depicted in FIG. 3, when a voltage lower than or equal to the gate threshold is applied to the gate electrodes 7 while a positive voltage being applied to the drain electrode 9 with respect to the source electrodes 8, the p-n junction of the p-type silicon carbide epitaxial layer 11 and the n-type well regions 12 is reverse-biased, the breakdown voltage of the active region is not reached, and no current flows. On the other hand, when a voltage higher than or equal to the gate threshold is applied to the gate electrodes 7, current flows due to an inversion layer formed on the surface of the p-type silicon carbide epitaxial layer 11 underneath the gate electrodes 7. Thus, MOSFET can be switched by the voltage applied to the gate electrodes 7.

SUMMARY OF THE INVENTION

According to one aspect of the present invention, a semiconductor device includes a wide-band-gap semiconductor substrate of a first conductivity type which is formed of a semiconductor having a band gap greater than that of silicon; a wide-band-gap semiconductor deposit layer of the first-conductivity-type, deposited on a front surface of the wide-band-gap semiconductor substrate and having an impurity concentration lower than that of the wide-band-gap semiconductor substrate; a semiconductor region of a second conductivity type, selectively disposed in a surface layer of the wide-band-gap semiconductor deposit layer on an opposite side of the wide-band-gap semiconductor substrate; a wide-band-gap semiconductor layer of the second conductivity type, formed of a semiconductor having a band gap greater than that of silicon, and disposed on surfaces of the wide-band-gap semiconductor deposit layer and the semiconductor region; a first region of the first conductivity type, selectively disposed in the wide-band-gap semiconductor layer so as to be on the wide-band-gap semiconductor deposit layer; a second region of the first conductivity type, selectively disposed in the wide-band-gap semiconductor layer; a contact region of the second conductivity type, selectively disposed in the wide-band-gap semiconductor layer; a gate electrode disposed, via a gate insulating film, on the second region and the first region; a source electrode contacting the contact region and the second region; an interlayer insulating film that covers the gate electrode; a drain electrode that is disposed on a back surface of the wide-band-gap semiconductor substrate; a plating film that is selectively disposed on the source electrode; and a pin electrode connected to the plating film via solder and carry out a signal to an external destination. The source electrode has a structure in which at least a Ti film, a TiN film, a Ti film, and a metal film containing aluminum are sequentially disposed.

In the semiconductor device, the source electrode has a structure in which a TiN film, a Ti film, a TiN film, a Ti film, and a metal film containing aluminum are sequentially disposed.

In the semiconductor device, the metal film containing aluminum is any one of an Al—Si film, an Al—Cu film, and an Al—Si—Cu film.

The semiconductor device further includes a protective film selectively disposed on the source electrode; and a second protective film covering a junction of the plating film and the protective film. The second protective film is a polyamide film.

According to another aspect of the present invention, a method of manufacturing a semiconductor device, includes forming on a front surface of a wide-band-gap semiconductor substrate of a first conductivity type which is formed of a semiconductor having a band gap greater than that of silicon, a wide-band-gap semiconductor deposit layer of the first conductivity type having an impurity concentration lower than that of the wide-band-gap semiconductor substrate; selectively forming a semiconductor region of a second conductivity type in a surface layer of the wide-band-gap semiconductor deposit layer; forming on a surface of the wide-band-gap semiconductor deposit layer, a wide-band-gap semiconductor layer of the second conductivity which is formed of a semiconductor having a band gap greater than that of silicon; selectively forming a first region of the first conductivity type in the wide-band-gap semiconductor layer so as to be on the wide-band-gap semiconductor deposit layer; selectively forming a second region of the first conductivity type in the wide-band-gap semiconductor layer; selectively forming a contact region of the second conductivity type in the wide-band-gap semiconductor layer; forming a gate electrode on the second region and the first region via a gate insulating film; forming a source electrode so as to contact the contact region and the second region; forming an interlayer insulating film so as to cover the gate electrode; forming a drain electrode on a back surface of the wide-band-gap semiconductor substrate; selectively forming a plating film on the source electrode; and forming a pin electrode so as to be connected to the plating film via a solder and carry out a signal to an external destination. The forming of the source electrode includes sequentially forming a Ti film, a TiN film, a Ti film, a metal film containing aluminum.

Objects, features, and advantages of the present invention are specifically set forth in or will become apparent from the following detailed description of the invention when read in conjunction with the accompanying drawings.

DETAILED DESCRIPTION OF THE INVENTION

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. The same n or p including + or − means similar impurity concentration, and does not necessarily mean the same impurity concentration. In the description of the embodiments below and the accompanying drawings, identical constituent elements will be given the same reference signs and will not be repeatedly described. Further, in the present description, when Miller indices are described, "−" means a bar added to an index immediately after the "−", and a negative index is expressed by prefixing "−" to the index.

Figure 1:
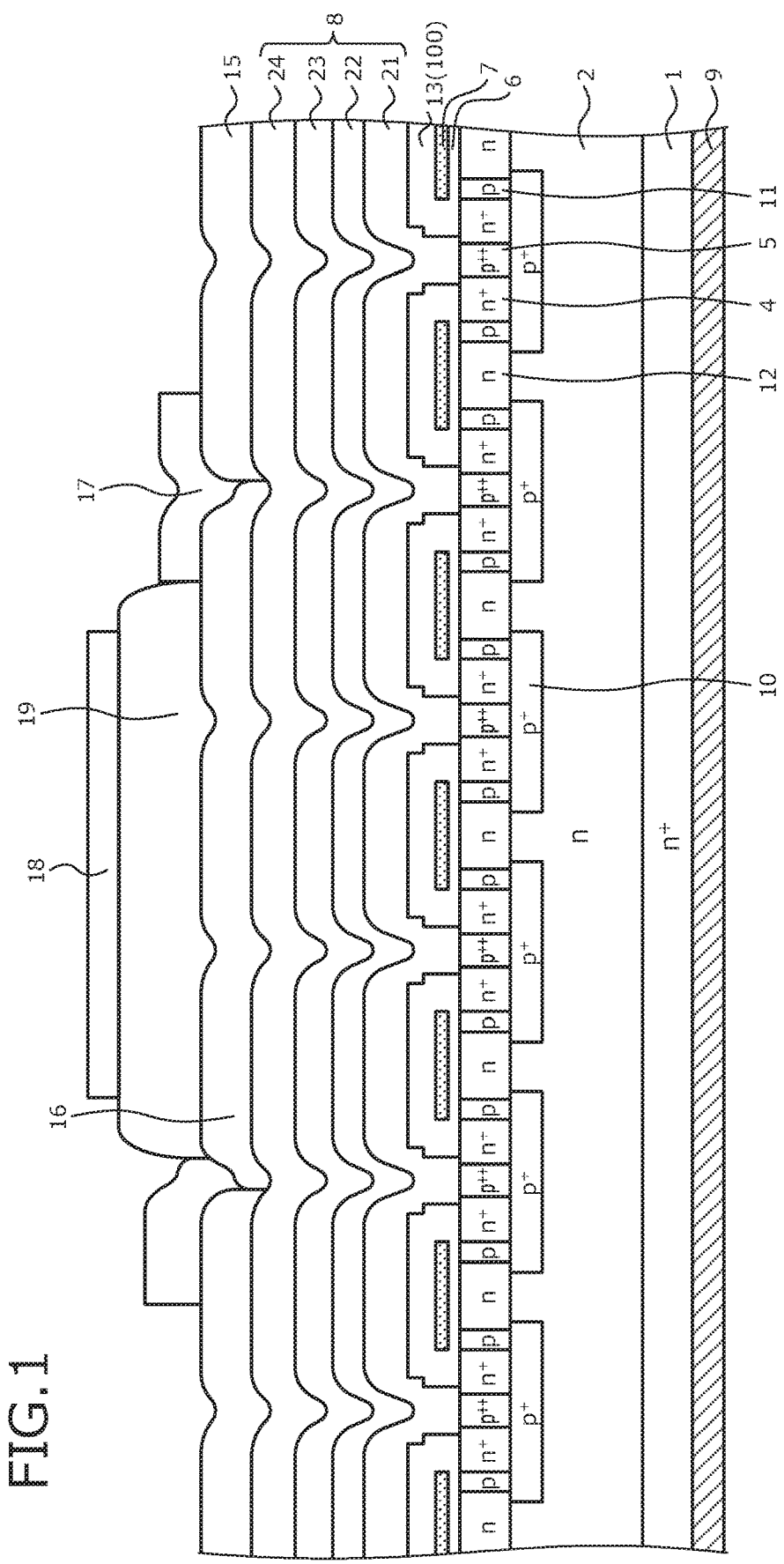
FIG. 1 is a cross-sectional view depicting the structure of a silicon carbide semiconductor device according to a first embodiment.

A semiconductor device according to the present invention is formed with a wide band gap semiconductor. In a first embodiment, a MOSFET is taken as an example to describe a silicon carbide semiconductor device produced by using, for example, silicon carbide (SiC) as a wide band gap semiconductor. FIG. 1 is a cross-sectional view depicting a structure of the silicon carbide semiconductor device according to the first embodiment. FIG. 1 depicts the state of an active region.

As depicted in FIG. 1, in the silicon carbide semiconductor device according to the first embodiment, an n-type silicon carbide epitaxial layer (wide-band-gap semiconductor deposit layer of a first conductivity type) 2 is deposited on a first principal surface (front surface) of an $n^+$-type silicon carbide substrate (wide-band-gap semiconductor substrate of the first conductivity type) 1.

The n+-type silicon carbide substrate 1 is, for example, a monocrystalline silicon carbide substrate into which nitrogen (N) is doped. The n-type silicon carbide epitaxial layer 2 is a low-concentration n-type drift layer into which, for example, nitrogen is doped at the impurity concentration lower than that of the n+-type silicon carbide substrate 1. In the following description, the n+-type silicon carbide substrate 1 and the n-type silicon carbide epitaxial layer 2 are collectively called a silicon carbide semiconductor base.

MOS gate (metal oxide semiconductor insulated gate) structures (device structures) are formed on a front surface side of the silicon carbide semiconductor base. In particular, p+-type regions (semiconductor region of a second conductivity type) 10 functioning as p-base layers are selectively disposed on a surface layer of the n-type silicon carbide epitaxial layer 2 on the opposite side of the n+-type silicon carbide substrate 1 (i.e., on the front surface side of the silicon carbide semiconductor base).

A p-type silicon carbide epitaxial layer 11 (wide-band-gap semiconductor layer of the second conductivity type) is deposited on the surfaces of the n-type silicon carbide epitaxial layer 2 and the p+-type regions 10. In the p-type silicon carbide epitaxial layer 11, n-type well regions 12 (first region of the first conductivity type) that penetrate the p-type silicon carbide epitaxial layer 11 in a depth direction and reach the n-type silicon carbide epitaxial layer 2 are disposed at portions above the n-type silicon carbide epitaxial layer 2. The n-type well regions 12 and the n-type silicon carbide epitaxial layer 2 form a drift region.

In the p-type silicon carbide epitaxial layer 11 and apart from the n-type well regions 12, n+-type source regions 4 (second region of the first conductivity type) are selectively disposed at portions facing the p+-type regions 10 in the depth direction. P++-type contact regions 5 (second-conductivity-type region) having an impurity concentration higher than that of the p-type silicon carbide epitaxial layer 11 are selectively disposed between the n+-type source regions 4 in the p-type silicon carbide epitaxial layer 11.

Gate electrodes 7 are disposed, via a gate insulating film 6, on the surfaces of portions between the n+-type source regions 4 and the n-type well regions 12 of the p-type silicon carbide epitaxial layer 11. The gate electrodes 7 may be disposed on the surfaces of the n-type well regions 12 via the gate insulating film 6.

An interlayer insulating film 13 is disposed on the front surface side of the silicon carbide semiconductor base so as to cover the gate electrodes 7. A boron phosphorus silicate glass (BPSG) film 100 is deposited as the interlayer insulating film 13.

Source electrodes 8 are disposed contacting and electrically connected to the n+-type source regions 4 and the p++-type contact regions 5 via contact holes of the interlayer insulating film 13.

In the source electrodes 8, a first Ti (titanium) film 21, a second TiN (titanium nitride) film 22, a second Ti film 23, and an Al—Si film 24 are deposited in this order. The Al—Si film 24 is, for example, an aluminum film including silicon at 1%.

The first Ti film 21 absorbs and blocks hydrogen (H) atoms/ions entering from the outside or generated in the Al—Si film 24, and thereby prevents the hydrogen atoms/ions from reaching the interlayer insulating film 13 of the layer below. Thus, the first Ti film 21 is made relatively thick. Hydrogen atoms/ions (hereinafter, "hydrogen ions") are particles including hydrogen atoms as a smallest constituent unit, i.e., hydrogen atoms, hydrogen ions, and hydrogen molecules. The second TiN film 22 prevents the first Ti film 21 from disappearing due to alloying with the Al—Si film 24. The second Ti film 23 improves adhesion with the Al—Si film 24.

The Al—Si film 24 may be an Al—Si—Cu film or an Al—Cu film. The Al—Si—Cu film is an aluminum film including silicon and copper at several % or less. The Al—Cu film is an aluminum film including copper at several % or less. Silicon or copper included in the aluminum film may suppress corrosion of the aluminum film. The aluminum film including silicon is hard, and thus contributes mitigate stress.

A drain electrode 9 is disposed on the back surface of the silicon carbide semiconductor base. A protective film 15 is selectively disposed on the source electrodes 8, and plating films 16 are disposed on the source electrodes 8 where no protective film 15 is disposed. The protective film 15 protects the front surface of the semiconductor device. The protective film 15 also prevents the plating of the plating films 16 from flowing to the outside, when the plating films 16 are formed. The protective film 15 also protects an edge termination structure (not depicted) enclosing the active region. The active region is a region where current flows when the semiconductor device is in on-state. The edge termination structure is a region that is disposed so as to enclose the active region, relaxes the electric field of the drift layer on the front surface side of the substrate, and prevents the breakdown voltage.

Second protective films 17 are disposed so as to selectively cover junctions of the plating films 16 and the protective film 15. The second protective films 17 cover gaps between the plating films 16 and the protective film 15, and prevent solder 19, for example, from entering the side of the base. The second protective films 17 function as masks when the solder 19 is disposed. The second protective films 17 may cover the entire surface of the protective film 15. Pin electrodes 18 connected to the plating films 16 via the solder 19 are disposed as a wiring member that carries out the voltage of the source electrodes 8 to an external destination. The pin electrodes 18 have a pin shape, and are connected to the source electrodes 8 to be perpendicular thereto.

For example, a 1200V-class MOSFET is taken as an example to describe a method of manufacturing a silicon carbide semiconductor device according to the embodiment. The n+-type silicon carbide substrate 1 into which nitrogen is doped at an impurity concentration of about $2 \times 10^{19}$ cm$^{-3}$, for example, is prepared. A principal surface of the n+-type silicon carbide substrate 1 may be, for example, a (000-1) surface having an off angle of about 4 degrees in the <11-20> direction.

The n-type silicon carbide epitaxial layer 2 into which nitrogen is doped at an impurity concentration of $1.0 \times 10^{16}$ cm$^{-3}$ is epitaxial-grown on the (000-1) surface of the n+-type silicon carbide substrate 1, so as to have a thickness of 10 μm.

A mask having predetermined openings is formed with, for example, resist by photolithography on the surface of the n-type silicon carbide epitaxial layer 2. Using this resist mask as a mask, a p-type impurity such as aluminum atoms is ion-implanted by ion implantation, thereby forming the p+-type regions 10 on a part of the surface region of the n-type silicon carbide epitaxial layer 2. The mask used in the ion implantation for forming the p+-type regions 10 is removed.

The p-type silicon carbide epitaxial layer 11 is epitaxial-grown on the surface of the n-type silicon carbide epitaxial layer 2, so as to have a thickness of 0.5 μm, for example. The p-type silicon carbide epitaxial layer 11 may be epitaxial-grown so as to have an impurity concentration of $2.0 \times 10^{16}$ cm$^{-3}$.

A mask having predetermined openings is formed with, for example, resist by photolithography on the surface of the p-type silicon carbide epitaxial layer 11. Using the resist mask as a mask, n-type impurity such as nitrogen is ion-implanted by ion implantation, thereby forming the n$^+$-type source regions 4 on a part of the surface region of the p-type silicon carbide epitaxial layer 11. The mask used in the ion implantation for forming the n$^+$-type source regions 4 is removed.

A mask having predetermined openings is formed with, for example, resist by photolithography on the surface of the p-type silicon carbide epitaxial layer 11. Using this resist mask as a mask, p-type impurity such as aluminum is ion-implanted by ion implantation, thereby forming the p$^{++}$-type contact regions 5 on a part of the surface region of the p-type silicon carbide epitaxial layer 11. The mask used in the ion implantation for forming the p$^{++}$-type contact regions 5 is removed.

A mask having predetermined openings is formed with, for example, resist by photolithography on the surface of the p-type silicon carbide epitaxial layer 11. Using this resist mask as a mask, n-type impurity such as nitrogen is ion-implanted by ion implantation, thereby forming the n-type well regions 12 on a part of the surface region of the p-type silicon carbide epitaxial layer 11. The mask used in the ion implantation for forming the n-type well regions 12 is removed.

An anneal process is performed for activating the n$^+$-type source regions 4, the p$^{++}$-type contact regions 5, and the n-type well regions 12. The temperature and the time of the anneal process may be 1620 degrees C. and 2 minutes, respectively.

The n$^+$-type source regions 4, the p$^{++}$-type contact regions 5, and the n-type well regions 12 may be formed in a different order.

The front surface side of the silicon carbide semiconductor base is subjected to thermal oxidation, and the gate insulating film 6 having a thickness of 100 nm is formed. The thermal oxidation may be performed in a mixed atmosphere of oxygen (O$_2$) and hydrogen (H$_2$) at the temperature of about 1000 degrees C. Thus, each of the regions formed on the surfaces of the p-type silicon carbide epitaxial layer 11 and the n-type silicon carbide epitaxial layer 2 is covered by the gate insulating film 6.

As the gate electrode 7, a polycrystalline silicon layer into which phosphorus (P), for example, is doped is formed on the gate insulating film 6. The polycrystalline silicon layer is patterned and selectively removed so as to be left on portions between the n$^+$-type source regions 4 and the n-type well regions 12 of the p-type silicon carbide epitaxial layer 11. The polycrystalline silicon layer may be left on the n-type well regions 12.

As the interlayer insulating film 13, the BPSG film 100 is formed so as to cover the gate electrodes 7. For example, a film of a boron phosphorus silicate glass (BPSG) having the thickness of 1.0 μm is formed. A reflow process is performed for flattening the BPSG film 100.

Contact holes are formed by pattering and selectively removing the interlayer insulating film 13, thereby exposing the n$^+$-type source regions 4 and the p$^{++}$-type contact regions 5.

A nickel film is formed by, for example, a sputtering process on the front surface side of the silicon carbide semiconductor base. Ohmic contacts with the silicon carbide semiconductor portions (the n$^+$-type source regions 4 and the p$^{++}$-type contact regions 5) are formed by reacting the silicon carbide semiconductor portions and the nickel film by sintering (anneal process), thereby forming a nickel silicide film.

The first Ti film 21, the second TiN film 22, the second Ti film 23, and the Al—Si film 24 are formed as the source electrodes 8. For example, the first Ti film 21 is formed by a sputtering process, and the second TiN film 22 is formed by a sputtering process on a top portion of the first Ti film 21. The second Ti film 23 is formed by a sputtering process on a top portion of the second TiN film 22. The Al—Si film 24 is formed by a sputtering process on a top portion of the second Ti film 23. Instead of the Al—Si film 24, an Al—Si—Cu film or an Al—Cu film may be formed. Here, "top portion" means upper portion when the direction from the n$^+$-type silicon carbide substrate 1 to the n-type silicon carbide epitaxial layer 2 is assumed as the upward direction.

A nickel film, for example, is formed as the drain electrode 9 on a surface of the n$^+$-type silicon carbide substrate 1 (the back surface of the silicon carbide semiconductor base). An ohmic contact of the n$^+$-type silicon carbide substrate 1 and the drain electrode 9 is formed by an anneal process at the temperature of 970 degrees C., for example.

As the drain electrode 9, for example, films of titanium, nickel (Ni), and gold (Au) are formed in this order on the surface of the nickel film. The protective film 15 is selectively formed on the source electrodes 8 on the front surface side of the silicon carbide semiconductor base.

Using the protective film 15 as a mask, the plating films 16 are selectively formed on the source electrodes 8 where no protective film 15 is formed. Thus, the plating films 16 are formed on the source electrodes 8, without the plating flowing to the edge termination structure. Using polymer resin including an imide, such as polyimide film, the second protective films 17 are selectively formed so as to cover junctions of the plating films 16 and the protective film 15.

The solder 19 is disposed on the plating films 16 using the protective film 15 and the second protective film 17 as a mask in the soldering, and the pin electrodes 18 connected to the plating films via the solders are formed. Thus, the MOSFET depicted in FIG. 1 is completed.

As described above, according to the first embodiment, the second TiN film disposed between the first Ti film and the Al—Si film in the source electrodes may suppress the first Ti film from becoming thinner due to alloying of the first Ti film and the Al—Si film, thereby suppressing penetration of hydrogen ions into the interlayer insulating film by the first Ti film. Thus, the threshold voltage of a semiconductor device in the low current range may be prevented from varying. The second Ti film disposed between the second TiN film and the Al—Si film may improve the adhesion of the source electrodes.

Figure 2:
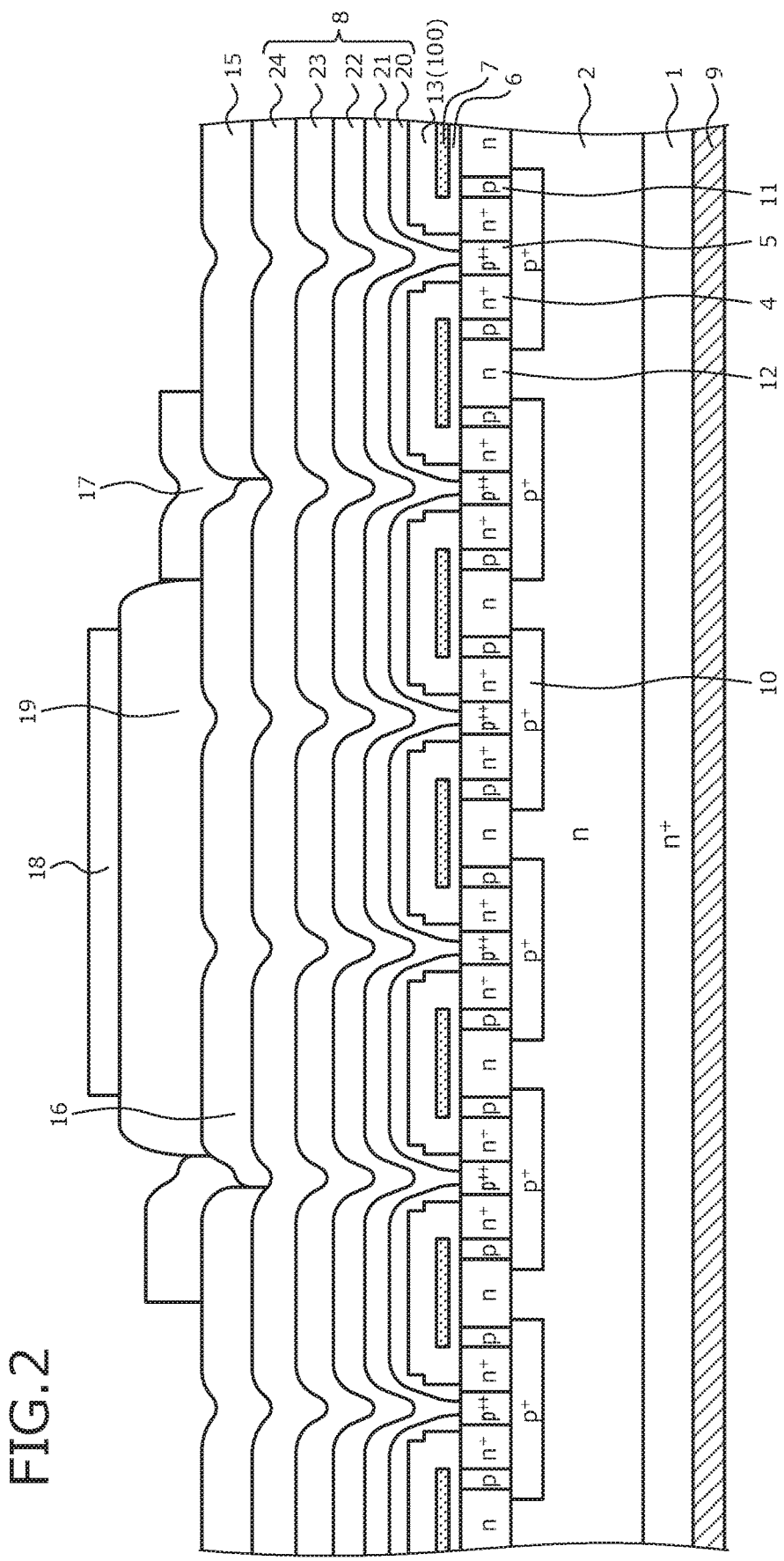
FIG. 2 is a cross-sectional view depicting the structure of a silicon carbide semiconductor device according to a second embodiment.

FIG. 2 is a cross-sectional view depicting a structure of a silicon carbide semiconductor device according to a second embodiment. The semiconductor device according to the second embodiment differs from that according to the first embodiment in that the source electrodes 8 have a five-layer structure in which a first TiN film 20 is further deposited between the silicon carbide semiconductor base and the first Ti film 21.

In the source electrodes 8, the first TiN film 20, the first Ti film 21, the second TiN film 22, the second Ti film 23, and the Al—Si film 24 are deposited in this order. The Al—Si film 24 may be an Al—Si—Cu film or an Al—Cu film.

The first TiN film 20 prevents nickel (Ni) from diffusing into the interlayer insulating film 13 in the anneal process for forming the nickel silicide film.

A method of manufacturing a semiconductor device according to the second embodiment is described. The process of forming the n-type silicon carbide epitaxial layer 2 to the process of forming the contact holes are sequentially performed in a similar manner to the first embodiment.

As the source electrode 8, the first TiN film 20 is formed by a sputtering process, for example. The first TiN film 20 is selectively removed, thereby exposing the n+-type source regions 4 and the p++-type contact regions 5 at the contact holes again. A nickel film (not depicted) that contacts the silicon carbide semiconductor portions (the n+ source regions 4 and the p++-type contact regions 5) exposed at the contact holes is formed by a sputtering process, for example. A nickel silicide film is formed by reacting the silicon carbide semiconductor portions and the nickel film by an anneal process, thereby forming ohmic contacts with the silicon carbide semiconductor portions. The first TiN film 20 arranged between the interlayer insulating film 13 and the nickel film prevents nickel atoms of the nickel film from diffusing into the interlayer insulating film 13. Portions that are of the nickel film and on the first TiN film 20 may be left or removed.

As the source electrodes 8, the first Ti film 21, the second TiN film 22, the second Ti film 23, and the Al—Si film 24 are sequentially formed in a similar manner to the first embodiment.

The process of forming the drain electrode 9 and the subsequent processes are sequentially performed in a similar manner to the first embodiment, thereby completing the MOSFET depicted in FIG. 2.

As described above, the silicon carbide semiconductor device and the manufacturing method thereof according to the second embodiment may achieve the effect similar to that of the silicon carbide semiconductor device and the manufacturing method thereof according to the first embodiment.

According to the semiconductor device and the manufacturing method thereof of the second embodiment, the first TiN film further deposited between the silicon carbide semiconductor base and the first Ti film in the source electrodes may prevent nickel atoms in the nickel film from diffusing and entering the interlayer insulating film during the anneal process for forming the ohmic contacts. Thus, the threshold of the semiconductor device may be prevented from varying.

The structure of a silicon carbide semiconductor device according to a third embodiment is not depicted, since the structure is similar to that according to the first embodiment. The semiconductor device according to the third embodiment differs from that according to the first embodiment in that the second protective film 17 is a polyamide film. The polyamide film is a synthetic polymer material including an amide in the molecule, and has adhesion greater than the polyimide film.

Similar to the polyimide film, the polyamide film covers at least triple-contact junctions where the plating film 16, the protective film 15, and the source electrode 8 contact each other. The polyamide film covering the triple-contact junctions improves the adhesion with the plating films (or the source electrodes exposed between the plating films and the protective film). The second protective film 17 may cover the entire surface of the protective film 15, thereby further improving the adhesion with the plating films (or the source electrodes exposed between the plating films and the protective film).

A method of manufacturing a silicon carbide semiconductor device according to a third embodiment is described. The process of forming the n-type silicon carbide epitaxial layer 2 to the process of forming the plating films 16 are sequentially performed in a similar manner to the first embodiment.

Using the polyamide film, the second protective films 17 are selectively formed so as to cover junctions of the plating films 16 and the protective film 15.

The process of forming the pin electrodes 18 is performed in a similar manner to the first embodiment, thereby completing the silicon carbide semiconductor device according to the third embodiment.

As described above, the silicon carbide semiconductor device and the manufacturing method thereof according to the third embodiment may achieve the effect similar to that of the silicon carbide semiconductor device and the manufacturing method thereof according to the first embodiment.

According to the semiconductor device and the manufacturing method thereof according to the third embodiment, the polyamide film used as the second protective films may improve the adhesion with the plating films (or the source electrodes exposed between the plating films and the first protective film), and may suppress penetration of solder into the side of the silicon carbide semiconductor base, thereby preventing degradation of the characteristics of the semiconductor device and suppressing degradation of the reliability.

In the third embodiment, the polyamide film is used as the second protective films 17 of the silicon carbide semiconductor device according to the first embodiment; However, the polyamide film may be used as the second protective films 17 of the silicon carbide semiconductor device according to the second embodiment. In this case, the effect similar to that of the silicon carbide semiconductor device and the manufacturing method thereof according to the second embodiment may be obtained.

A MOSFET is taken as an example to describe the embodiments of the present invention; however, not limited to this, the present invention may be applied to various semiconductor devices having various structures, for example, a MOS device such as IGBT, a semiconductor device in which stress concentration occurs in the device structure due to a step of the interlayer insulating film, etc. An example where silicon carbide is used as the wide band gap semiconductor is described in the embodiments described above; however, a similar effect may be obtained by using a wide band gap semiconductor other than silicon carbide, such as gallium nitride (GaN). In the embodiments, the first conductivity type is an n-type while the second conductivity type is a p-type; however, the present invention may be implemented when the first conductivity type is a p-type while the second conductivity type is an n-type.

Figure 3:
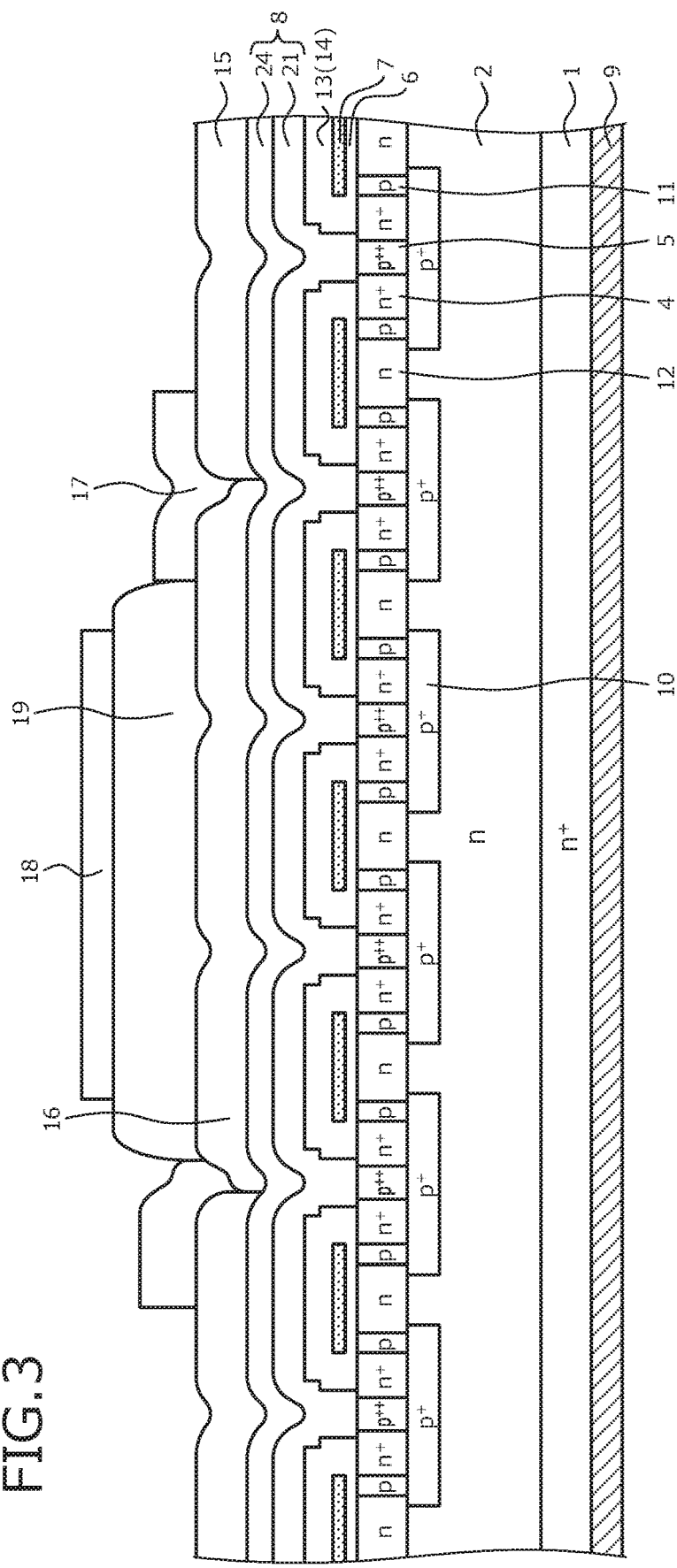
FIG. 3 is a cross-sectional view depicting the structure of a conventional silicon carbide semiconductor device.

Further, in a conventional structure such as that depicted in FIG. 3, since the source electrode 8 has a 2-layer structure of the first Ti film 21 and the Al—Si film 24, the titanium and aluminum form an alloy, whereby the first Ti film 21, which is a hydrogen (H) adsorbing metal, disappears and the threshold voltage may vary consequent to the negative impact of hydrogen ions from an external source.

However, as described above, according to the present invention, the second TiN film disposed between the first Ti film and the Al—Si film in the source electrodes may suppress the first Ti film from becoming thinner consequent to alloying of the first Ti film and the Al—Si film, thereby suppress penetration of hydrogen ions into the interlayer insulating film by the first Ti film. Thus, the threshold of a semiconductor element in the low current range may be prevented from varying. The second Ti film disposed between the second TiN film and the Al—Si film may improve the adhesion of the source electrodes.

The first TiN film further deposited between the silicon carbide semiconductor base and the first Ti film in the source electrodes may prevent nickel from diffusing and entering the interlayer insulating film during the anneal process. Thus, the threshold of the semiconductor device may be prevented from varying.

The polyamide film used as the second protective films may improve the adhesion with the plating films (or the source electrodes exposed between the plating films and the protective film), and may suppress penetration of solder into the side of the silicon carbide semiconductor base, thereby preventing degradation of the characteristics of the semiconductor device and suppressing degradation of the reliability.

The semiconductor device and the method of manufacturing a semiconductor device may suppress variation in characteristics, and may provide a highly-reliable semiconductor device.

As described above, the semiconductor device according to the present invention is useful for high-voltage semiconductor devices used in power converting equipment such as converters and inverters, and power supply devices such as those in various industrial machines. In particular, the semiconductor device is suitable for a silicon carbide semiconductor device that uses pin electrodes as a wiring member to carry out the voltage of the front surface electrodes.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a substrate formed of a wide-band-gap semiconductor material that has a band gap greater than that of silicon, the substrate having a front surface and a back surface;
   a deposit layer formed of the wide-band-gap semiconductor material and having an impurity concentration lower than that of the substrate, the deposit layer having a first side and a second side opposite to the first side, and being deposited on the front surface of the substrate that is located on the second side;
   a semiconductor region selectively disposed in the deposit layer on the first side thereof;
   a semiconductor layer formed of the wide-band-gap semiconductor material, disposed on a surface of the deposit layer on the first side and a surface of the semiconductor region formed in the deposit layer, the semiconductor layer having selectively disposed therein a first region, a second region and a contact region;
   a gate electrode disposed, via a gate insulating film, on the semiconductor layer and the first region;
   an interlayer insulating film covering the gate electrode;
   a source electrode in contact with the contact region and the second region;
   a drain electrode disposed on the back surface of the substrate;
   a plating film selectively disposed on the source electrode; and
   a pin electrode in contact with the plating film, wherein
   the substrate, the deposit layer, and the first and second regions formed in the semiconductor layer are of a first conductivity type,
   the semiconductor region, the semiconductor layer and the contact region formed therein are of a second conductivity type,
   the source electrode has
      a first titanium nitride (TiN) film, and
      a first titanium (Ti) film, a second TiN film, a second Ti film, and a metal film containing aluminum (Al) sequentially formed on the first TiN film,
   the first TiN film is formed to cover, and in direct contact with, the interlayer insulating film,
   the first TiN film has a plurality of openings formed therein, through which the first Ti film is in contact with the contact region, the first TiN film completely separating the interlayer insulating film from the first Ti film,
   the first Ti film is formed to fully cover, and in direct contact with, the first TiN film,
   the second TiN film is formed to fully cover, and in direct contact with, the first Ti film,
   the second Ti film is formed to fully cover, and in direct contact with, the second TiN film, and
   the metal film containing Al is formed to fully cover, and in direct contact with, the second Ti film.

2. The semiconductor device according to claim 1, wherein the metal film containing Al is any one of an Al-silicon (Si) film, an Al—Cu (Copper) film, and an Al—Si—Cu film.

3. The semiconductor device according claim 1, wherein the first region is formed on the semiconductor region.

4. The semiconductor device according claim 1, wherein the pin electrode is soldered to the plating film.

5. The semiconductor device according to claim 1, wherein the first TiN film is selectively removed to thereby expose the contact region.

6. A method of manufacturing a semiconductor device, comprising:
   providing a substrate of a first conductivity type, formed of a wide-band-gap semiconductor material that has a band gap greater than that of silicon;
   forming, on a front surface of the substrate, a deposit layer made of the wide-band-gap semiconductor material, the deposit layer being of the first conductivity type and having an impurity concentration lower than that of the substrate;
   selectively forming, in the deposit layer, a semiconductor region of a second conductivity type;
   forming, on a surface of the deposit layer, a semiconductor layer of the second conductivity formed of the wide-band-gap semiconductor material;
   selectively forming a first region of the first conductivity type in the semiconductor layer;
   selectively forming a second region of the first conductivity type in the semiconductor layer;
   selectively forming a contact region of the second conductivity type in the semiconductor layer;
   forming a gate electrode on the semiconductor layer and the first region via a gate insulating film;
   forming an interlayer insulating film to cover the gate electrode;
   forming a source electrode to contact the contact region and the second region, including
      forming a first titanium nitride (TiN) film to cover, and in direct contact with, the interlayer insulating film, the first TiN film being selectively removed to have a plurality of openings therein, and forming a first titanium (Ti) film, a second TiN film, a second Ti film, and a metal film containing aluminum (Al) sequentially on the first TiN film, the first Ti film being in contact with the contact region through the plurality of openings, a remaining portion of the first TiN film completely separating the interlayer insulating film from the first Ti film;

forming a drain electrode on a back surface of the substrate;

selectively forming a plating film on the source electrode; and forming a pin electrode in contact with the plating film, wherein the first Ti film is formed to fully cover, and in direct contact with, the first TiN film, the second TiN film is formed to fully cover, and in direct contact with, the first Ti film, the second Ti film is formed to fully cover, and in direct contact with, the second TiN film, and the metal film containing Al is formed to fully cover, and in direct contact with, the second Ti film.

7. The method of claim 6, wherein the first region is formed on the semiconductor region.

8. The method of claim 6, wherein forming the pin electrode includes soldering the pin electrode to the plating film.

9. The method of claim 6, wherein the first TiN film is selectively removed to thereby expose the contact region.

* * * * *